United States Patent [19]

Millerick et al.

[11] Patent Number: 4,978,830
[45] Date of Patent: Dec. 18, 1990

[54] LASER TRIMMING SYSTEM FOR SEMICONDUCTOR INTEGRATED CIRCUIT CHIP PACKAGES

[75] Inventors: Michael A. Millerick, San Jose; Michael W. Patterson, Pleasanton, both of Calif.

[73] Assignee: National Semiconductor Corporation, Santa Clara, Calif.

[21] Appl. No.: 316,501

[22] Filed: Feb. 27, 1989

[51] Int. Cl.5 .................. B23K 26/00; B23K 26/14
[52] U.S. Cl. ..................... 219/121.67; 219/121.72; 219/121.75; 219/121.84
[58] Field of Search ........... 219/121.6, 121.85, 121.61, 219/121.62, 121.67, 121.72, 121.74, 121.75, 121.8, 121.83, 121.84; 364/474.08; 174/52.1, 52.2, 52.4

[56] References Cited

U.S. PATENT DOCUMENTS

| | | | |
|---|---|---|---|
| 4,190,759 | 2/1980 | Hongo et al. | 219/121.85 X |
| 4,444,801 | 4/1984 | Hongo et al. | 219/121.85 X |
| 4,673,795 | 6/1987 | Ortiz, Jr. | |
| 4,701,781 | 10/1987 | Sankhagowit | 174/52.2 X |
| 4,720,621 | 1/1988 | Langen | 219/121.62 X |
| 4,796,080 | 1/1989 | Phy | 174/52.1 X |

Primary Examiner—C. L. Albritton
Attorney, Agent, or Firm—Limbach, Limbach & Sutton

[57] ABSTRACT

An automatic laser trimming apparatus (30) for semiconductor integrated chip packages removes dambars (16) and performs deflashing and degating operations. The apparatus combines a laser machining subsystem (32, 36) with a machine vision subsystem (38, 40) to accurately locate the treat and dambars on an integrated circuit package. A defocusing lens (54) is used to attenuate the intensity of the laser beam (34) to permit a single laser to perform both the dambar removal and deflashing operations. In addition, an improved fixture (46) is provided to enhance the removal of smoke and debris from the processing station and to provide improved backlighting thereby enhancing resolution.

16 Claims, 3 Drawing Sheets

LASER TRIMMING SYSTEM FOR SEMICONDUCTOR INTEGRATED CIRCUIT CHIP PACKAGES

TECHNICAL FIELD

The subject invention relates to a laser trimming apparatus for semiconductor integrated circuit chip packages. The system is specifically designed for the fully automatic precision removal of dambars as well as the deflashing and degating of semiconductor lead frame packages.

BACKGROUND OF THE INVENTION

A considerable amount of effort has been expended developing methods of manufacturing semiconductor integrated circuit chip packages. For example, the assignee of the subject invention has developed an automated tape bonding process for fabricating such chips. This process is described in U.S. Pat. No. 4,701,781, issued Oct. 20, 1987, to Sankhagowit, the disclosure of which is incorporated herein by reference. The development of another similar type of chip package is described in U.S. Pat. No. 4,796,080, issued Jan. 3, 1989 to Phy, and incorporated herein by reference.

As described in U.S. Pat. No. 4,701,781, during fabrication of chip packages utilizing the tape bonding technique, an integrated circuit die is bonded to a copper tape. The copper tape includes a plurality of conductive leads which are electrically connected to the integrated circuit die. The die is then encapsulated using a plastic material in a molding step. Simultaneously, a carrier is encapsulated peripherally around and spaced from the die package. The resultant package 10 is shown in FIG. 1. During the encapsulation process a gate 12 is formed between the die 13 and the carrier 14.

In order to keep the leads 15 co-planar and properly aligned during the fabrication steps, conductive dambars or tie bars 16a and 16b are initially formed on the copper tape 17 and located to be near the inner die 13 and the outer carrier 14 respectively. The dambars 16 also act as a stop to prevent the plastic encapsulant from flowing out between the leads and past the dambars. During the encapsulation step, some of the flowing plastic will, however, be trapped between the die and the dambar 16a (shown at 18 in FIG. 1) and between the carrier and the outer dambar 16b (shown at 20 in FIG. 1).

Once the encapsulation step is completed, the conductive copper dambars 16a and 16b and the trapped plastic flash 18, 20 must be removed. In the past, this removal was done mechanically with a punch. This approach is satisfactory as long as the spacing between the leads does not get too small. However, as the number of leads increases and the spacing between the leads decreases, it becomes quite difficult to mechanically remove the dambars. Moreover, when the dambars are placed very close to the encapsulant, the problems with mechanical removal become more acute. In the prior art, laser machining systems have supplanted mechanical machining approaches in certain applications where high precision is required, such as in trimming resistors. However, no attempts have been made to utilize a laser machining system to remove the dambars as well as plastic flash trapped by the dambars from an integrated circuit package.

In order to develop such a system, a number of difficulties must be addressed and solved that were not encountered in other laser machining applications. For example, it was recognized that dambar removal and plastic deflashing operations required two different intensity laser beams. More specifically, the copper dambars must be cut with a relatively high intensity laser beam. In contrast, since plastic has a lower melting point, a lower intensity beam could be used. In fact, a lower intensity beam should be used for a number of reasons. For example, the removal of trapped plastic flash from between the leads requires that the beam be directed quite close to the integrated circuit package. If a high powered beam were used, the die could be damaged. In addition, a higher power beam interacting with the plastic encapsulant could form carbon deposits which are conductive and could lead to shorted leads and package failure.

Accordingly, to carry out the subject invention a means is needed to generate laser beams of different power. This need could be addressed by using two lasers. However, in order to save cost, it would be desirable to vary the power output of a single laser. The laser beam power can be controlled by varying the input power to the laser itself or by jittering the mirrors delivering the beam to the workpiece. Neither of these latter solutions were particularly desirable due to their complexity and the fact that these approaches would slow the operation of the system. Accordingly, it would be desirable to produce two different intensity beams in a manner which is simple and low in cost.

Another problem which is encountered when trying to implement an automated machining system is the fact that due to the composite material used, encapsulated chip packages undergo non-uniform shrinkage during fabrication. It has been found that the extent of the shrinkage problem actually increases a the size of the silicon die (and hence the number of leads on the package) is increased. Because the shrinkage is non-uniform, the exact locations of the leads and dambars for each package can not be predicted. Thus, in order to design an automated device, the laser machining system must be combined with a vision system which can locate the dambars on the package so that they may be treated with the laser beam.

When combining a vision system with a laser machining device, various considerations must be addressed. For example, the machining operation will create smoke and debris which must be removed from the machining site so that it will not obscure the vision system. Moreover, this removal should be in a direction away from the incoming laser beam such that it does not interfere with the delivery optics or reduce the power of the beam delivered to the workpiece. Accordingly, it would be desirable to provide an improved vacuum fixture for holding the integrated circuit chip package in a manner to enhance the operation of the vision system and laser machining operation.

Accordingly, it is an object of the subject invention to provide a new and improved apparatus for processing leads of a semiconductor chip package.

It is another object of the subject invention to provide a new and improved apparatus for processing leads of a semiconductor chip package which includes a combination vision system and laser processor.

It is a further object of the subject invention to provide a new and improved apparatus for the precision automatic removal of dambars from a semiconductor chip package.

It is still a further object of the subject invention to provide an apparatus which can automatically remove both dambars and plastic flash trapped between the leads of a semiconductor chip package.

It is still another object of the subject invention to provide a processing apparatus where the power of the laser beam can be easily controlled.

It is still a further object of the subject invention to provide an apparatus for processing integrated circuit chip packages including a means for attenuating a laser beam to permit both dambar removal and deflashing operations.

It is still another object of the subject invention to provide laser machining apparatus where a defocusing lens is moved into the beam of a laser to change the intensity of the beam that reaches the workpiece.

It is still a further object of the subject invention to provide an improved fixture for use in a laser machining apparatus which includes a means for drawing gas down past the workpiece and away from the laser optics.

It is still another object of the subject invention to provide a fixture for holding a workpiece in a processing apparatus which enhances the image in a machine vision system.

SUMMARY OF THE INVENTION

In accordance with the above stated objects, an integrated high volume fully automated apparatus has been developed for processing a semiconductor chip package. The system consists of a laser machining subsystem including a laser and a galvanometer beam positioner. The system also includes a machine vision system for locating the dambars on an integrated circuit chip package. The machine vision system includes its own galvanometer mirror scanner system. The entire system is controlled by a microprocessor.

The subject system includes a material handling system for moving lead frame strips having the integrated circuit chip packages thereon into a processing zone. In accordance with the subject invention, a new and improved fixture is provided to clamp the part prior to treatment. The fixture includes top and bottom members which reciprocate with respect to each other. When a part is moved into place, the top and bottom members are clamped together to form a vacuum seal. A vacuum inlet is provided in the bottom member for drawing smoke and debris away from the processing site. The top member is provided with a central opening through which the laser beam can be directed to the workpiece.

The top member also includes a means for directing the flow of gas downwardly through the gaps between the leads in the chip package. In the prior art, one method of generating a downward flow of gas was to use a back pressure lens covering the central opening and forcing air downwardly. This approach is undesirable in the subject system because the laser beam would have to pass through the lens. More specifically, during operation, the beam from the laser is moved through many angles by the scanning system to reach and treat various portions of the leads. If the beam is forced to pass through a lens, the various changes in angles will cause the light to be refracted in a nonuniform manner resulting in the loss of the high accuracy needed to process the leads.

To overcome this problem a circumferential channel is provided in the top member for directing the flow of gas downward. A venturi effect is created which draws additional air in from the outside and down into the channel. By this arrangement, the field around the workpiece can be kept clear enabling the vision system to accurately image the workpiece. The gas flow also insures that smoke and debris are removed such that the losses in beam energy are minimized.

The fixture is also designed to enhance the digital resolution of the vision system. More specifically, the fixture is designed to provide a diffuse backlight on the workpiece. The latter approach provides far better image resolution and contrast than top lighting which could reflect off the cooper leads back into the camera. In order to achieve this result, both a magnifying lens and diffuser lens are mounted in the bottom member of the fixture. The diffuser lens also provides the additional function of filtering the laser beam power after it passes by the workpiece.

In operation, a chip package is brought into the fixture and clamped. The vision system then locates the dambars and precisely identifies the positions of the leads. This information is stored in the memory of the processor. Simultaneous with the visual scanning, the processor controls the operation of a Q-switched YAG laser to cut the links of a dambar between the leads. After all the copper links of one dambar have been cut, the intensity of the beam is attenuated so that the trapped plastic flash between the leads can be vaporized without creating carbon deposits. The beam is attenuated by moving a defocusing lens into the beam path. The beam can then be passed over the area which needs to be deflashed to vaporize the material.

As can be appreciated, the use of the defocusing lens permits the cutting of the dambars and the vaporization of the plastic encapsulant between the leads with a single laser beam. The use of the defocusing lens also allows the treatment area to be expanded thereby increasing processing speed.

When the vaporization step is complete, the laser beam is repositioned at the next dambar in the package. The defocusing lens is removed from the beam path, and the cutting is reinitiated. The subject system can also be used to cut the gate 12 from between the die 13 and the carrier 14.

After the dambars are removed and the deflashing and degating steps are completed, the fixture is opened and the material handling system moves the completed piece out of the fixture and into an output magazine allowing the next package to be put in its place. FIG. 2 illustrates package 10a which has been processed in accordance with the subject invention. As can be seen, the leads 15 now extend freely between the die 13 and the carrier 14.

Further objects and advantages of the subject invention will become apparent from the following detailed description taken in conjunction with the drawings in which:

DETAILED DESCRIPTION OF THE PREFERRED EMBODIMENT

Figure 3:
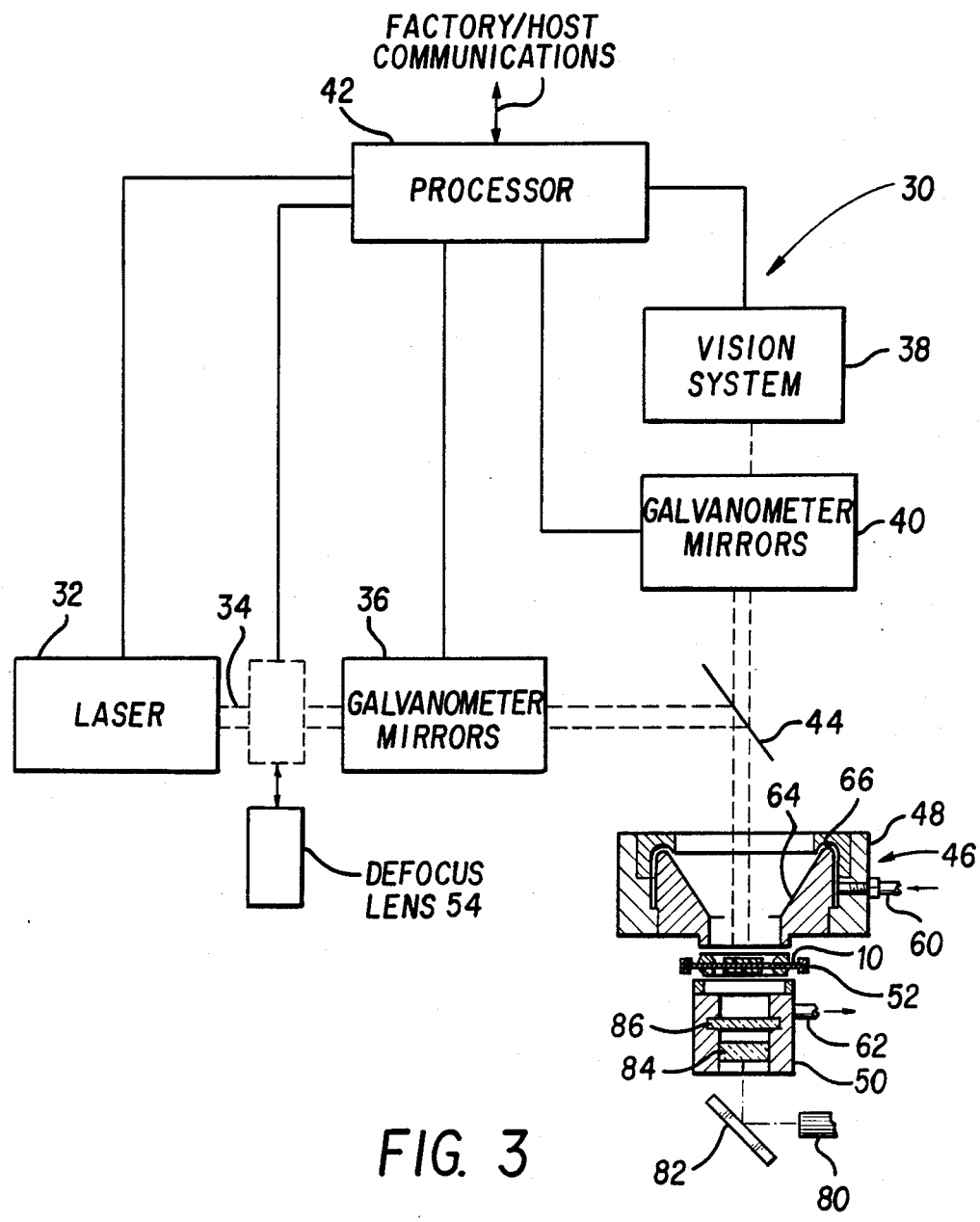
FIG. 3 is a schematic diagram of the overall system of the subject invention.

Referring first to FIG. 3, there is illustrated a block diagram of the overall system 30 of the subject invention. The system is designed for the precision removal of dambars and plastic flash from semiconductor lead frame packages. As noted above, the use of such a precision system becomes highly desirable when the number of leads on the packages is increased and the spacing is decreased. It has been found to be extremely difficult to mechanically perform these functions when the lead pitch (distance between the center points of adjacent leads) is .020 inches or less and lead count per side is greater than 20.

The subject system 30 includes a number of major subsystems. These subsystems include a laser 32 for generating an infrared laser beam 34. The beam is directed into a first set of galvanometer mirrors 36 for controlling the direction of the beam. The system 30 further includes a machine vision system 38 for viewing the workpiece. The vision system is controlled by a second set of galvanometer mirrors 40. The laser 32, vision system 38 and galvanometer mirrors 36, 40 are all controlled by a processor 42. The processor operates with software designed to provide real time machine control, process setup and monitoring as well as communications to a factory host external computer system.

A dichroic mirror 44 is provided to redirect the path of the IR laser beam down towards a fixture 46. Dichroic mirror 44 is transparent to visible light allowing the vision system 38 to image the chip package.

Figure 4:
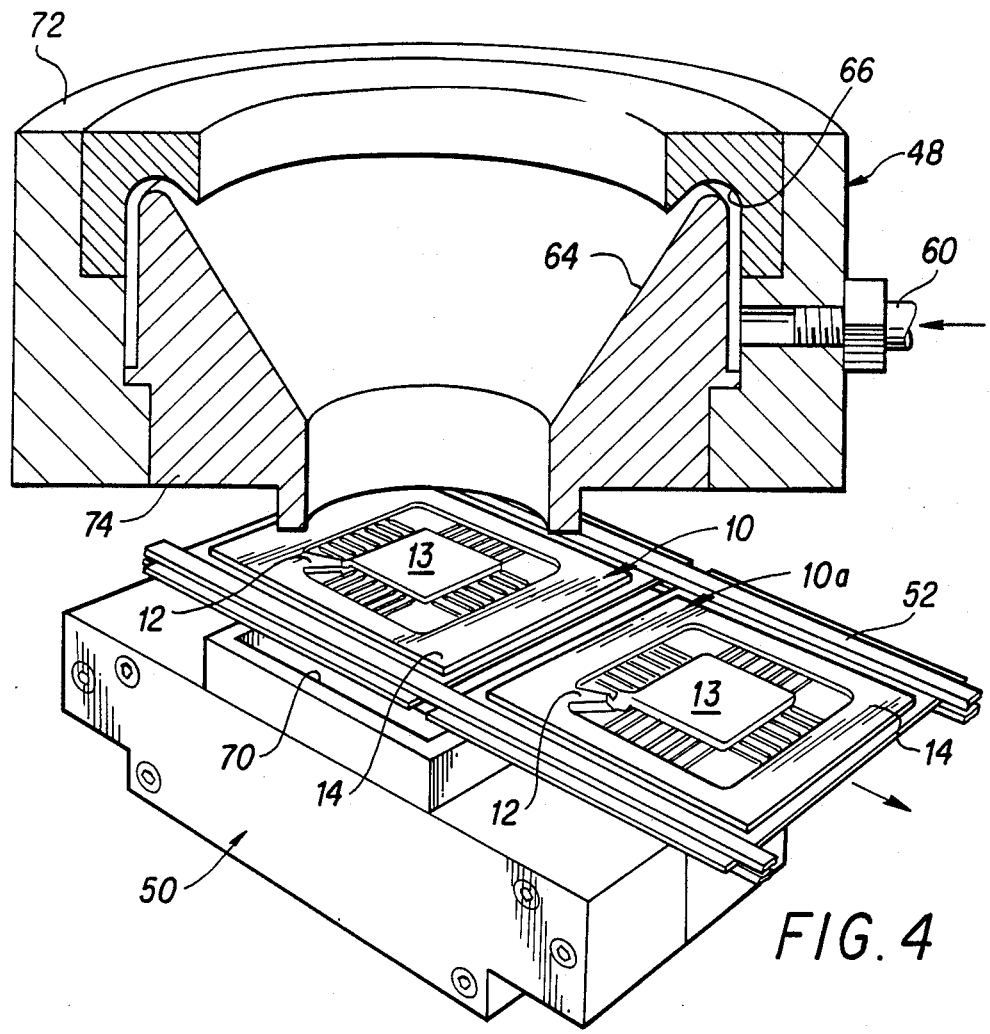
FIG. 4 is a composite view, partially in perspective, partial in cross-section, of the improved fixture of the subject invention.
Figure 5:
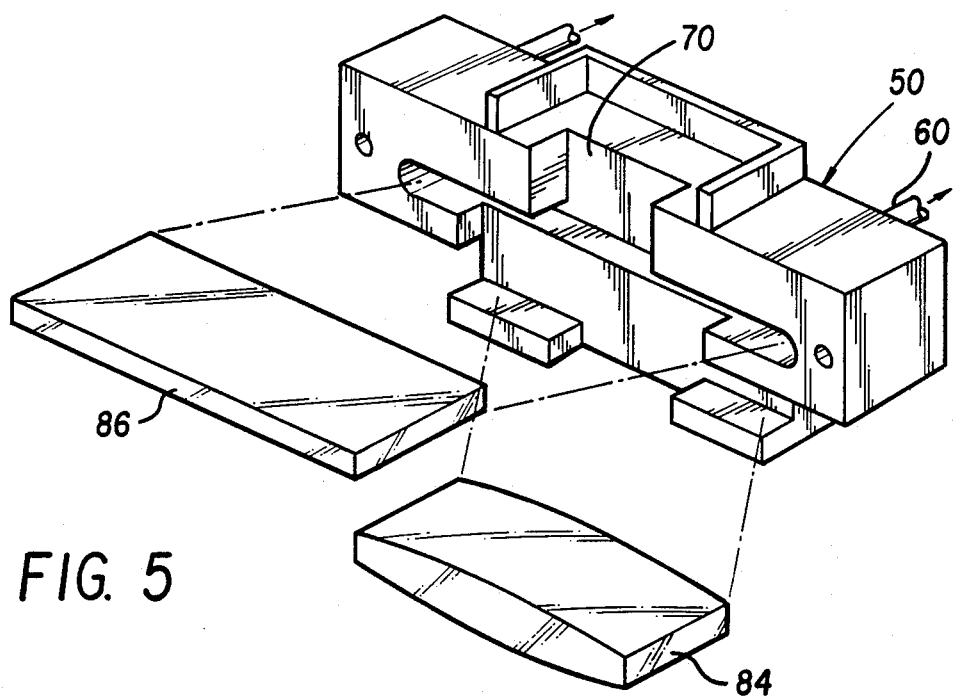
FIG. 5 is a partial, exploded view of the bottom member of the fixture of the subject invention.
Figure 6:
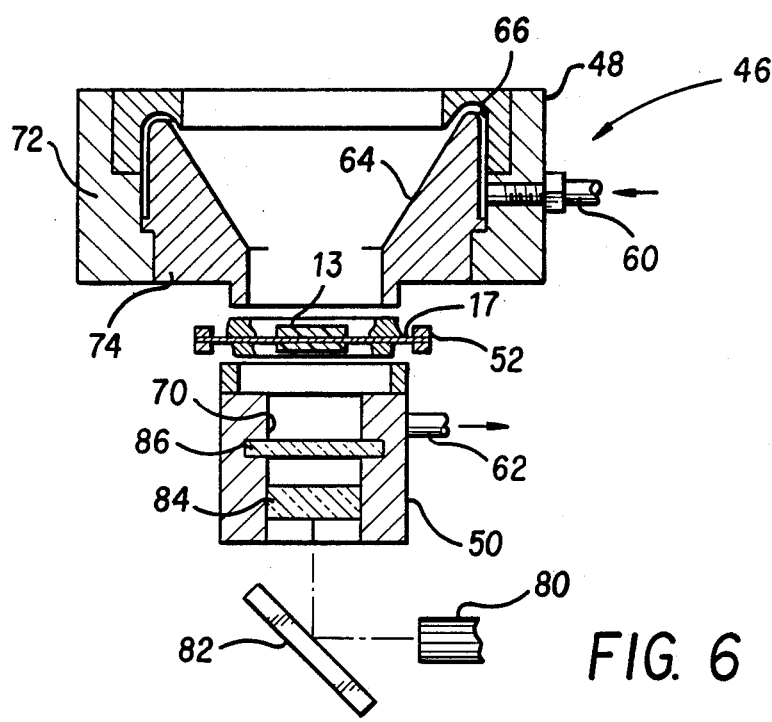
FIG. 6 is a cross-sectional view of the fixture of the subject invention.

Fixture 46 includes a top member 48 and a bottom member 50 which will be discussed in greater detail below with reference to FIGS. 4 through 6. The semiconductor lead frame packages 10 is positioned in the fixture utilizing a track system 52 partially shown in FIGS. 3 and 4.

In operation, the machine vision system will search for and locate the dambars on the package and provide that information to the processor. The processor then controls the operation of the laser 32 and the galvanometer mirrors 36 to trim the dambars from the package 10. After the dambars are trimmed, a defocusing lens 54 is moved into the path of the laser beam 32 to attenuate its intensity. The lower intensity laser beam is then used to remove the plastic flash 18, 20, from the package. Debris and smoke produced by the trimming operation is removed by a vacuum system attached to fixture 46. After the trimming is completed, the part is declamped from the fixture and indexed out of the work station.

Having briefly described the overall system and its operation, the subsystems will now be described in greater detail.

In the preferred embodiment, laser 32 is defined by a Teradyne laser trim system, Model W429, which was initially designed for trimming resistors. The laser system includes a 10 watt CW Q-switched YAG laser capable of delivering a peak pulsed power of 25 kilowatts and a maximum energy of 2.375 millijoules. A stand alone power supply with embedded cooling unit and a stand alone Z cart operator console are also included.

The vision system 38 includes a CCD camera, specialized optics, fiber optic coaxial lighting and a monochrome NTSC video monitor with external sync. A suitable vision system can be obtained from View Engineering, Model 719C image processing system. The image processor is a 256×256 pixel resolution binary based feature extractor. The software includes algorithms based on edge detection technology for searching and locating the dambars along the perimeter of the lead frame package. Positional information obtained based on pixel values are recorded and communicated serially to the processor 42.

The galvanometer mirror system 40 consists of a chassis having three controllers that are responsible for closed loop X, Y and Z galvanometer access control. Each access controller has a corresponding matching galvanometer transducer with attached mirror. Positional data is communicated serially from the host system to each controller.

The galvanometers convert electrical current information into mechanical energy via shaft rotation. Accordingly, the mirror rotation of the galvanometer system is controlled by varying the current flow to the system 40. The closed loop galvanometer transducer also converts rotational position into voltage. This voltage, along with the positional data supplied by the host system, lets the galvanometer controller control the current to the galvanometer until the desired field of view is reached. A suitable galvanometer mirror system is manufactured by General Scanning and selected from the DG and DX series systems.

Processor 42 is designed around a high speed Motorola 68000 microprocessor and is structured with a 7 slot VME bus configuration. The control system supports multiport serial communication, interrupt driven digital input/output, high resolution stepper motor control and battery backed-up memory. Operating software is loaded into the controller via a floppy disk system.

The integrated circuit packages 10 can be loaded in to the fixture 46 with any suitable material handling system. In the preferred embodiment, the lead frame strips carrying the integrated circuit packages are preloaded into slots in a magazine which is placed on an input magazine elevator platform. A stepper motor driven mechanism sequentially indexes the magazine to bring each slot level with the horizontal index tracker 52 shown in FIG. 4. Indexing is accomplished by a ratchet drive system consisting of a stepper motor driven eccentric cam operating a motor shaft which, in turn, is linked to the drive shafts for indexing pawls on each side of the fixture. The motion of the shafts cause the indexing pawls to engage registration holes (not shown) in the lead frame to produce the index. After processing, the lead frame strip is automatically indexed into an output magazine. A sensor detects when each strip is fully loaded into the magazine slot. Upon detection, a stepper motor drives the elevator to bring the next empty slot level with the indexer track.

As noted above, the material handling system functions to move the integrated circuit packages into position within the fixture 46. Fixture 46 will now be described in greater detail with reference to FIGS. 4 through 6.

Fixture 46 includes a top member 48 and a bottom member 50 which are reciprocated with respect to one another to lock the lead frame in position during the processing operation. In the preferred embodiment, bottom member 50 is indexed in the vertical direction utilizing an eccentric cam driver.

In accordance with the subject invention, fixture 46 is provided with a pneumatic system for removing smoke and debris from the workpiece area. The pneumatic system includes an air input 60 fed into top member 48. A vacuum outlet 62 is provided in bottom member 50. The air input from line 60 funnels a flow of air down through central opening 64, through the spaces in the workpiece and down into bottom member 50. Central opening 64 provides a path for the laser beam and a window which allows the vision system to image the package.

As noted above, attempts have been made to force an airflow downwardly through a fixture to drive smoke and debris away from laser optics. In the past this result was achieved by placing a lens over the central opening to create back pressure in a manner to force air downwardly through the fixture. This approach is undesirable in the subject system because the laser beam would have to pass through that lens. More specifically, during operation, the beam from the laser is moved through many angles by the scanning system 36 to reach and treat various portions of the leads. If a beam were forced to pass through such a lens, the changes in angles would cause the light to be refracted in a non-uniform manner resulting in the loss of the high accuracy needed to process the leads.

To overcome this problem in the subject invention, the gas input system is designed to create a downward flow of air without using a backpressure lens. As illustrated in FIGS. 4 and 6, a circumferential channel 66 is provided in communication with the inlet 60. Circumferential channel 66 functions to turn and route the incoming air downwardly along the sides of opening 64. Because of the narrowed channel 66 and the reversal of direction of the flow, a low pressure venturi effect is created enhancing the flow of air downwardly through the package 10 in the fixture. By this arrangement, the vision system can continue to image the part even during cutting. In addition, losses in laser beam energy are minimized.

In the preferred embodiment, the air flow to inlet 60 is defined by an 80 psi supply controlled by a solenoid valve. In addition, top member 48 is comprised of an outer portion 72 and a threaded removable inner portion 74. The inner portion 74 may be replaced with pieces having different size central openings 64 to accommodate different lead frame part sizes.

After the air flow passes through the workpiece, it enters a central channel 70 in bottom member 50 and is removed by the vacuum outlet 62. In the preferred embodiment, the vacuum supply is operated at 20 inches of mercury and is controlled by a solenoid valve and filter. The vacuum system also functions to clamp the part in place. An adjustable vacuum sensor is provided to vary the vacuum as the filter becomes full.

Fixture 46 is also designed to provide backlighting of the package 10 to enhance the digital resolution of the vision system 38. The backlighting is provided by a fiber optic bundle 80 which throws its illumination on a reflector 82 positioned at 45 degrees. The light from the fiber optic bundle is rotated through 90 degrees and is redirected upwardly through the central channel 70 in bottom member 50.

In accordance with the subject invention, the bottom member 50 further includes a magnifier lens 84 and a diffuser lens 86. The magnifier lens is provided to collimate the incoming light from the fiber optic and focus it over the area of the diffuser lens 86. Diffuser lens 86 functions to even out the light supplied to the lead frame assembly. Diffuser lens 86 also functions to filter the IR laser light that travels past the workpiece. The backlighting scheme is desirable since it helps define the edges of the leads. A top lighting approach could result in reflections off the copper tape reducing resolution and is therefore undesirable.

In the preferred embodiment, magnifier lens 84 is a 38 mm. lens purchased from Edmund Scientific Company, Part No. A36,226. Diffuser lens 86 is also from Edmund Scientific Company, Part No. A4009 and is 38 mm.

Figure 1:
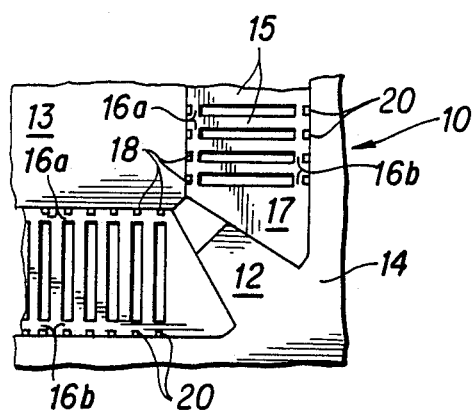
FIG. 1 is a partial top plan view of a semiconductor lead frame package prior to processing by the subject invention.

Having described the system components and the unique fixture of the subject invention, its automatic operation will now be discussed. As noted above, in operation, an integrated circuit chip package 10, as shown in FIG. 1, is moved into the fixture 46 utilizing the material handling system. The bottom member 50 of the fixture is indexed upwardly using an eccentric cam. The vacuum system is energized clamping the part in place between top and bottom members 48 and 50.

If the package in the system is the first one of a particular type, the general location of the dambars must be initially established. In this procedure, the galvanometer mirrors 40 are moved to find the four inner dambars 16a (i.e., the dambars located closer to die 13). The position of each of the inner dambars is then stored in memory. The galvanometer mirrors are then moved to find the outer dambar 16b positions (i.e., the dambars closer to the carrier 14). At the conclusion of this procedure, the general locations of the 8 dambars for the particular type package being processed are stored in memory facilitating faster searching for the chip packages to follow.

Assuming the system is initialized as described above, the galvanometer mirrors 40 are rotated in a manner to move the field of view of the vision system to the first general location of one dambar 16a. When the image processor receives an image of the dambar via the camera, it processes this image and passes the vision galvanometer mirror 40 location to the host computer defining the actual location of the dambar. This information is then passed to the galvanometer mirrors 36 controlling the scanning of the laser beam. The full power of the Q-switched YAG laser is then directed to the dambar locations to cut through the copper material.

When each of the links of the dambar along one side of the package are removed, the processor then commands the defocusing lens 54 to be moved into the output path of the laser beam 34. The defocusing lens functions to reduce the intensity of the beam as it reaches the workpiece. It also spreads out the beam by a factor of about 3 from the focused beam. This reduced power beam functions to vaporize the plastic flash without harming the die or carbonizing the plastic. When the plastic flash is vaporized, the copper dambars will be released from the package and drop away. In the preferred embodiment, the laser beam is scanned over the plastic flash approximately 5 times to vaporize the material.

In accordance with the subject invention, as the laser is operating using the positional information supplied by the processor, the vision system is busy locating the next dambar location. The vision system can operate virtually simultaneously with the operation of the laser. The only times when the vision is halted is during the deflashing operation where the diffuse brightness of the light will interrupt the ability of the vision system to accurately image the dambars.

When the first dambar has been cut and the plastic flash associated therewith is removed, the laser beam is then moved to the next dambar to continue the operation. Once again, the dambars are cut with the full power laser beam and the plastic flash is removed with an attenuated laser beam.

Figure 2:
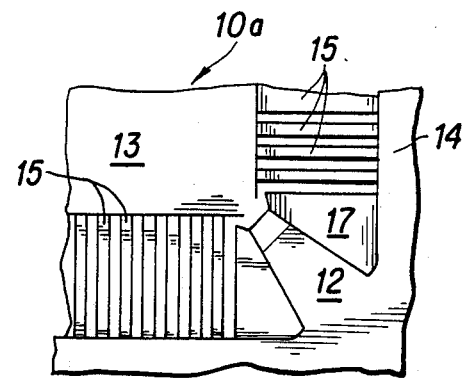
FIG. 2 is a partial top plan view of a lead frame package similar to FIG. 1 shown after processing in accordance with the apparatus of the subject invention.

In addition to the dambar removal and deflashing operation, the subject system also performs a degating operation. In the degating operation, the connection between the gate 12 and the die 13 is broken. Since this step also consists of plastic removal, it is performed with the defocusing lens 54 in place. When all of the dambars are removed, and the deflashing and degating operations are completed, a package as shown in FIG. 2 is produced. As can be seen, the conductive leads 15 extend freely between the die 13 and the carrier 14 with no dambars or plastic flash in between. In addition, the gate 12 is separated from the die 13. The finished package is then indexed out of the fixture and the process can be repeated.

In summary, there has been provided a new and improved automatic laser trimming apparatus for semiconductor integrated chip packages. The system is designed for the precision removal of dambars as well as the deflashing and degating of semiconductor lead frame packages. The system combines a laser machining subsystem with a machine vision subsystem to accurately locate and process the dambars on an integrated circuit package. In accordance with the subject invention, a defocusing lens is used to attenuate the intensity of the laser beam to permit a single laser to perform both the dambar removal and deflashing operations. In addition, an improved fixture is provided to enhance the removal of smoke and debris from the processing station and to provide improved backlighting to enhance resolution.

While the subject invention has been described with reference to a preferred embodiment, various changes and modifications could be made therein by one skilled in the art without varying from the scope and spirit of the subject invention as defined by the appended claims.

We claim:

1. An apparatus for processing integrated circuit chip packages, each said chip package having a plurality of closely spaced leads, and wherein said chip package further includes dambars for alignment of the leads and wherein said apparatus is adapted to remove said dambars as well as any plastic flash trapped by the dambars, said apparatus comprising:
   laser for generating a laser beam;
   means for defocusing the beam of the laser such that its area is increased and areal intensity is reduced at the point of interaction with the chip package; and
   processor means for controlling the laser and the defocusing means whereby said beam may first be used to cut the dambars and thereafter said beam is defocusing by said attenuation means such that the plastic flash trapped by the dambars can be vaporized and the remainder of the dambars can be removed.

2. An apparatus as recited in claim 1 wherein said defocusing means includes a lens movable into the path of the laser beam.

3. A method for processing integrated circuit chip packages, each said chip package having a plurality of closely spaced leads, and wherein said chip package further includes dambars for alignment of the leads, said method for processing integrated circuit chip packages including the removal of said dambars as well as any plastic flash trapped by the dambars, said method comprising the steps of:
   directing a laser beam to the leads in the chip package in order to cut the dambars;
   attenuating the laser beam so that the intensity reaching the leads is reduced; and
   directing the attenuated laser beam to vaporize the plastic flash trapped by the dambar thereby releasing the dambar.

4. A method as recited in claim 3 wherein said attenuation step is performed by defocusing the laser beam.

5. A method as recited in claim 4 wherein said step of defocusing the laser beam is performed by moving a lens in the path of the beam.

6. An apparatus for processing leads of a semiconductor chip package comprising:
   a vision system means for locating leads on the chip package;
   first scanner means for directing the vision system means;
   a laser for generating a laser beam;
   second scanner means, independent of said vision system means for directing the laser beam; and
   processor means connected to and controlling the vision system means, laser and both scanner means whereby information about the location of the leads in the chip package generated by the vision system means is used to independently control the second scanner means and direct the laser beam to process the leads.

7. An apparatus as recited in claim 6 wherein said chip package is of the type which includes a plurality of closely spaced leads and dambars connected thereto, and wherein said vision system means further functions to locate the dambars on the leads of the chip package, and wherein said processor means uses information about the location of the dambar generated by the vision system means to direct the laser beam in order to remove the dambars from the leads.

8. An apparatus as recited in claim 7 further comprising:
   means for defocusing the laser beam delivered to the chip package and wherein said processor means further functions to cause said defocused beam to remove plastic flash located adjacent said dambars.

9. A method of removing dambars from the leads of integrated circuit chip packages comprising the steps of:
   scanning the chip package to identify the location of a dambar utilizing a machine vision system; and
   directing a laser beam to the identified location to remove the dambar from the package.

10. A method as recited in claim 9 wherein said scanning step further includes the steps of:
   scanning the chip package with the vision system to identify the location of the edge of a dambar; and
   scanning the dambar with the vision system to identify locations between leads; and wherein said method further includes the steps of:
   storing the locations identified in the scanning steps; and
   directing a laser beam to the identified locations between the leads to remove the dambar from the package.

11. A method as recited in claim 10 wherein the scanning steps are performed concurrently with the directing step to maximize processing speed.

12. A method as recited in claim 10 wherein directing step further comprises the steps of:
 cutting the dambar between each lead; and
 vaporizing any material between the leads to release the dambar.

13. A method as recited in claim 12 wherein the vaporizing step is performed by attenuating the intensity of the laser beam with respect to the intensity of the laser beam during the cutting step.

14. A method as recited in claim 13 wherein the laser beam is attenuated by defocusing.

15. A method as recited in claim 13 wherein said chip package is defined by an inner die surrounded by a peripheral carrier and wherein a plastic gate connects the die and the carrier, said method further including the steps of:
 scanning the chip package with the vision system to identify the location of the gate;
 directing the attenuated laser beam to the gate to break the connection between the die and the carrier.

16. A method as recited in claim 10 further including the step of directing a flow of gas past the chip package to remove smoke and debris for enhancing the efficiency of the laser operation and improving the imaging of the vision system.

* * * * *